(12) United States Patent
Dixon et al.

(10) Patent No.: US 9,831,281 B2
(45) Date of Patent: Nov. 28, 2017

(54) ELECTRICAL INTERCONNECTS FOR PHOTODIODE ARRAYS AND READOUT INTERFACE CIRCUITS IN FOCAL PLANE ARRAY ASSEMBLIES

(71) Applicant: Sensors Unlimited, Inc., Princeton, NJ (US)

(72) Inventors: Peter Dixon, Lawrenceville, NJ (US); Robert Rozploch, Newtown, PA (US)

(73) Assignee: Sensors Unlimited, Inc., Princeton, NJ (US)

( * ) Notice: Subject to any disclaimer, the term of this patent is extended or adjusted under 35 U.S.C. 154(b) by 266 days.

(21) Appl. No.: 14/702,174

(22) Filed: May 1, 2015

(65) Prior Publication Data

US 2017/0025464 A1    Jan. 26, 2017

(51) Int. Cl.
*H01L 27/146* (2006.01)

(52) U.S. Cl.
CPC .. *H01L 27/14636* (2013.01); *H01L 27/14618* (2013.01); *H01L 27/14632* (2013.01); *H01L 27/14634* (2013.01)

(58) Field of Classification Search
CPC ......... H01L 27/14618; H01L 27/14632; H01L 27/14634; H01L 27/14636
See application file for complete search history.

(56) References Cited

U.S. PATENT DOCUMENTS

| | | | |
|---|---|---|---|
| 6,407,374 B1 * | 6/2002 | Sato | H01L 27/14601 250/208.1 |
| 6,867,496 B1 | 3/2005 | Hashimoto | |
| 7,349,223 B2 | 3/2008 | Haemer et al. | |
| 7,361,989 B1 | 4/2008 | Adkisson et al. | |
| 7,645,701 B2 | 1/2010 | Anderson et al. | |
| 7,973,272 B2 | 7/2011 | DeFlumere et al. | |
| 8,008,584 B2 | 8/2011 | Tu et al. | |
| 8,167,936 B2 | 5/2012 | Kurian | |
| 8,372,726 B2 | 2/2013 | de Graff et al. | |
| 8,709,936 B2 | 4/2014 | Volant et al. | |
| 8,797,491 B2 | 8/2014 | Kim et al. | |
| 2003/0155516 A1 * | 8/2003 | Spartiotis | G01T 1/2928 250/370.09 |
| 2006/0231941 A1 | 10/2006 | Huang et al. | |
| 2008/0093721 A1 * | 4/2008 | Kang | H01L 27/14618 257/680 |
| 2013/0235210 A1 | 9/2013 | Tinkler et al. | |
| 2014/0138543 A1 | 5/2014 | LaVeigne | |
| 2014/0263954 A1 | 9/2014 | Dixon | |
| 2014/0263955 A1 | 9/2014 | Dixon | |
| 2014/0264340 A1 | 9/2014 | Mani et al. | |
| 2014/0267756 A1 | 9/2014 | Gousev et al. | |

FOREIGN PATENT DOCUMENTS

| | | |
|---|---|---|
| CN | 102593133 A | 7/2012 |
| CN | 102610619 A | 7/2012 |

* cited by examiner

*Primary Examiner* — Francis M Legasse, Jr.
(74) *Attorney, Agent, or Firm* — Locke Lord LLP; Scott D. Wofsy; Christopher J. Cillié

(57) ABSTRACT

A focal plane array assembly includes a readout integrated circuit with a contact array surface, a photodiode array with a contact array surface facing the readout integrated circuit contact array surface, and an anisotropic conductive film disposed between contact array surfaces. The anisotropic conductive film includes conductive bodies that interconnect the photodiode array with the readout integrated circuit and an adhesive that couples the photodiode array to the readout integrated circuit.

16 Claims, 3 Drawing Sheets

ELECTRICAL INTERCONNECTS FOR PHOTODIODE ARRAYS AND READOUT INTERFACE CIRCUITS IN FOCAL PLANE ARRAY ASSEMBLIES

GOVERNMENT LICENSE RIGHTS STATEMENT

This invention was made with government support under Contract No. HR0011-13-C-0068 awarded by the Defense Advanced Research Projects Agency. The government has certain rights in the invention.

BACKGROUND OF THE INVENTION

1. Field of the Invention

The present disclosure relates to integrated circuit packaging, and more particularly to electrical interconnects for focal plane array integrated circuit packages.

2. Description of Related Art

Electronic assemblies commonly include printed circuit boards with integrated circuits coupled to the printed circuit board. Electrical interconnects are typically formed between the integrated circuits and printed circuit board using wire bonds. Individual wire bonds are typically attached at opposite ends to interconnected devices. Some electronic assemblies also include integrated circuits connected directly to other integrated circuits in a stacked arrangement. Such stacked integrated circuits are generally interconnected by solder-based interconnects. Once the solder-based electrical interconnects are formed, an underfill material is typically flowed between the interconnects to provide device protection.

Such conventional methods and systems have generally been considered satisfactory for their intended purpose. However, there is still a need in the art for integrated circuit packages with improved interconnects. The present disclosure provides a solution for this need.

SUMMARY OF THE INVENTION

A focal plane array (FPA) assembly includes a readout integrated circuit (ROIC) with a contact array surface, a photodiode array (PDA) with a contact array surface facing the ROIC contact array surface, and an anisotropic conductive film (ACF) disposed between PDA and ROIC contact array surfaces. The ACF includes conductive bodies that interconnect the PDA with the ROIC and an adhesive that mechanically couples the PDA to the ROIC.

In certain embodiments the film can encapsulate the interconnects that extend between the PDA and the ROIC. The encapsulation can be quasi-hermetic. A topside of the PDA that is opposite the PDA contact array surface can include pixel circuitry. The topside can be free from wire bond connections. In accordance with certain embodiments, the focal plane assembly can include a window. The window can face the PDA contact array surface. The window can also abut to the PDA contact array surface. The window can be separated from the PDA by a gap.

In another aspect, a package assembly includes a printed circuit board (PCB) that defines an aperture and an FPA assembly as described above. The FPA assembly is coupled to the PCB and includes a ROIC that spans the aperture. The FPA assembly can also include a wire bond fanout connecting the ROIC with the PCB. The ACF can interconnect the ROIC with the wire bond fanout. Alternatively or additionally, the ACF can interconnect the PCB with the wire bond fanout. The package assembly can also include a window. The window can span the aperture and be separated from the PDA by a gap or can be disposed within the aperture and abut the PDA.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION OF THE PREFERRED EMBODIMENTS

Figure 1:
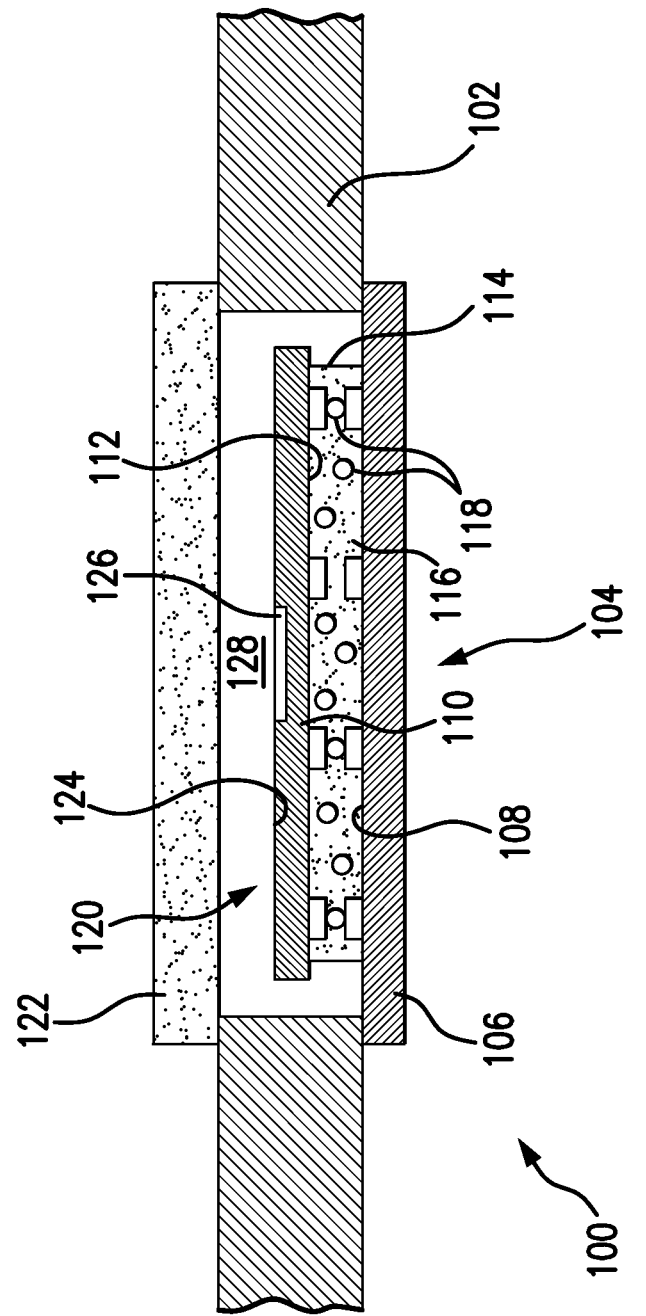
FIG. 1 is a schematic cross-sectional side view of an exemplary embodiment of a package assembly constructed in accordance with the present disclosure, showing a focal plane array (FPA) package assembly including anisotropic film (ACF), a printed circuit board, and a window.

Reference will now be made to the drawings wherein like reference numerals identify similar structural features or aspects of the subject disclosure. For purposes of explanation and illustration, and not limitation, a partial view of an exemplary embodiment of a package assembly in accordance with the disclosure is shown in FIG. 1 and is designated generally by reference character 100. Other embodiments of electronic assemblies in accordance with the disclosure, or aspects thereof, are provided in FIGS. 2-3, as will be described. The systems and methods described herein can be used to provide focal plane array assembles and/or package assemblies with reduced (or eliminated) wire bond, improving manufacturability and facilitating ruggedizing such assemblies.

As shown in FIG. 1, a package assembly 100 includes a printed circuit board (PCB) 102 and a focal plane array (FPA) assembly 104 coupled to PCB 102. FPA assembly 104 includes a readout integrated circuit (ROIC) 106 with a contact array surface 108, a photodiode array (PDA) 110 with a contact array surface 112 facing ROIC contact array surface 108, and an anisotropic conductive film (ACF) 114. ACF 114 is disposed between PDA contact array surface 112 and ROIC contact array surface 108.

ACF 114 includes a film 116 and a plurality of conductive bodies 118 distributed within film 116. Film 116 may include an adhesive material, such as a resin, with sufficient adhesive strength to fix PDA 110 to ROIC 108. Conductive bodies 118 may be spherical in shape and include a material such as nickel or gold. An example of a suitable ACF material is 3M™ Anisotropic Conductive Film 5363, available from the 3M Company of St. Paul, Minn.

PCB 102 defines an aperture 120 that extends through a thickness of PCB 102. ROIC 106 spans aperture 120. PDA 110 and ACF 114 are disposed within aperture 120. A window 122 is also coupled to PCB 102 and spans aperture 120 such that a gap 128 is defined between window 122 and PDA 110. Gap 128 extends between a topside 124 of PDA 110 and window 122. PDA topside 124 includes pixel circuitry 126 for acquiring image data includes in light received through window 122. It is contemplated that pixel circuitry 126 may acquire image data from short wave infrared (SWIR) radiation and/or near infrared short wave infrared (NIRSWIR) radiation.

Figure 2:
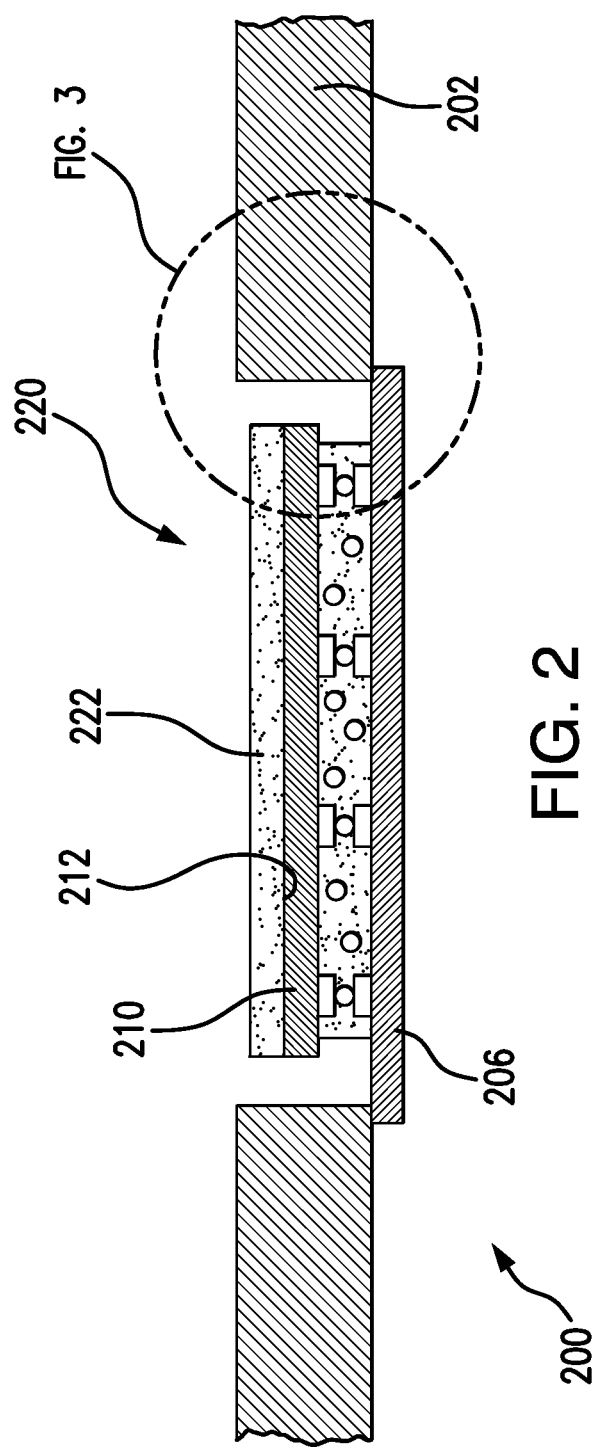
FIG. 2 is a schematic cross-sectional side view of another embodiment of an FPA package assembly, showing a window directly abutting the FPA package assembly.

With reference to FIG. 2, a package assembly 200 is shown. Package assembly 200 is similar to package assembly 100 and additionally includes a window 222. Window 222 is disposed within an aperture 220 defined by PCB 202 and directly abuts PDA 210 such a lower surface of window 222 contacts a topside 224 of PDA 210. Those skilled in the art will readily appreciate that by bonding window 222 directly to PDA 210 image quality can be improved due to the reduced reflections by eliminating gap 128 (shown in FIG. 1).

Figure 3:
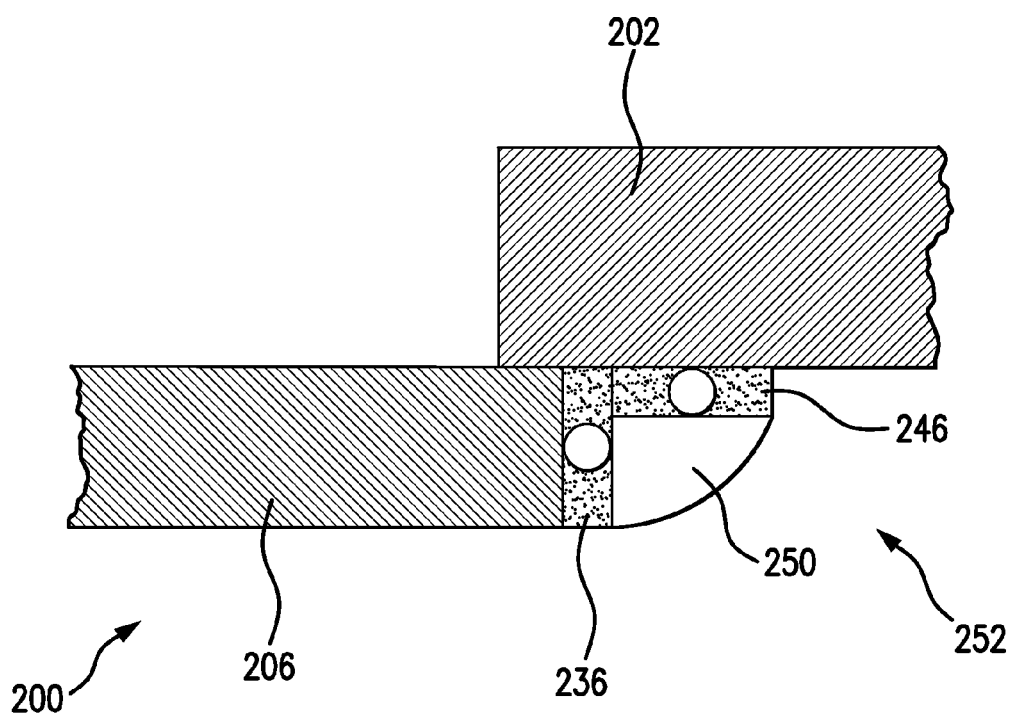
FIG. 3 is a schematic cross-sectional side view of an embodiment of a package assembly, showing a wire bond fanout interconnecting a readout integrated circuit (ROIC) of the FPA package assembly using ACF.

With reference to FIG. 3, a portion of package assembly 200 is shown, according to an embodiment. Package assembly 200 includes a wire bond fanout 252 that interconnects ROIC 206 with PCB 202. Wire bond fanout 252 includes at least one wire bond 250. On an end of wire bond 250 ACF 236 connects wire bond 250 with ROIC 206. On an opposite end, ACF 246 connects wire bond 250 with PCB 202.

A method for forming an FPA assembly, e.g. FPA 104, includes applying ACF, e.g. ACF 116, to a ROIC, e.g. ROIC 106. The method also includes aligning a PDA, e.g. PDA 110 to ROIC 106 and adhering ROIC 106 to PDA 110. The method further includes applying pressure to the FPA assembly such that the ACF bonds the ROIC to the PDA, conductive bodies (e.g. conductive bodies 118) defines electrical interconnects between the ROIC and PDA, and film included in the ACF (e.g. film 116) quasi encapsulates the electrical interconnects extending between the ROIC and PDA. Those skilled in the art will readily appreciate that the method can enable constructing a FPA having a stacked PDA and ROIC without requiring underfill between the stacked PDA and ROIC to ensure device functionality. The resulting FPA can also be free of wire bonds, allowing for construction of an FPA with a smaller size or PDA having more area suitable for pixel circuitry.

In embodiments described herein, use of ACF can simplify the manufacture of FPA assemblies by providing (a) electrical connectivity, (b) quasi-hermetic sealing by film reflow during assembly, and (c) and mechanical coupling of the ROIC and FPA using the epoxy disposed within the film. The quasi-hermetic seal can provide an environmental protective barrier, providing device functionality in adverse environments. In certain embodiments, the ACF can also be employed for the fanout to the PCB—thus enabling a chip on board solution without requiring wire bonds.

The methods and systems of the present disclosure, as described above and shown in the drawings, provide for focal plane arrays and packaging therefor with superior properties including reduced size, increased manufacturability, and increased mitigation ability for artifacts such as light scattering. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A focal plane array assembly, comprising:
   a readout integrated circuit (ROIC) having a contact array surface;
   a photodiode array (PDA) having a contact array surface facing the ROIC contact array surface;
   an anisotropic conductive film (ACF) directly contacting the PDA contact array surface and the ROIC contact array surface,
   wherein the ACF includes conductive bodies that interconnect the PDA with the ROIC and adhesive that mechanically couples the PDA to the ROIC.

2. The focal plane array assembly as recited in claim 1, wherein the film encapsulates the interconnects extending between the PDA and the ROIC.

3. The focal plane array assembly as recited in claim 1, wherein a topside of the PDA opposite the PDA contact array surface includes pixel circuitry.

4. The focal plane array assembly as recited in claim 1, wherein a topside of the PDA opposite the PDA contact array surface is free from wire bond connections.

5. The focal plane array assembly as recited in claim 1, further including a window facing the PDA contact array surface.

6. The focal plane array assembly as recited in claim 5, wherein the window directly abuts the PDA contact array surface.

7. The focal plane array assembly as recited in claim 5, wherein the window is separated from the PDA contact array surface by a gap.

8. A package assembly, comprising:
   a printed circuit board (PCB) defining an aperture and having a thickness;
   a focal plane array assembly as recited in claim 1 coupled to the PCB,
      wherein the PDA is arranged within the aperture and is contained within the thickness of the PCB, and wherein the ROIC spans the aperture and couples the PDA to the PCB.

9. The package assembly as recited in claim 8, wherein the film encapsulates the interconnects extending between the PDA and the ROIC.

10. The package assembly as recited in claim 8, further including a wire bond fanout connecting the ROIC with the PCB.

11. The package assembly as recited in claim 10, wherein the ACF interconnects the ROIC with the wire bond fanout.

12. The package assembly as recited in claim 10, wherein the ACF interconnects the PCB with the wire bond fanout.

13. The package assembly as recited in claim 8, further including a window facing the PDA contact array surface.

14. The package assembly as recited in claim 13, wherein the window is disposed within the aperture and directly abuts the PDA contact array surface.

15. The package assembly as recited in claim 13, wherein the window spans the aperture and is separated from the PDA contact array surface by a gap.

16. A method of making a focal plane array assembly, comprising:
   applying an anisotropic conductive film (ACF) to a readout interface circuit (ROIC);
   adhering an anisotropic contact film (ACF) directly to a contact array surface of the ROIC; and
   adhering a contact array surface of photodiode array (PDA) to the ROIC such that the ACF directly contacts the contact array surface of the ROIC and the contact array surface of the PDA.

* * * * *